(12) United States Patent
Shouho et al.

(10) Patent No.: US 10,701,295 B2
(45) Date of Patent: Jun. 30, 2020

(54) IMAGING DEVICE INCLUDING OUTPUT SIGNAL LINE AND LOAD TRANSISTOR AND CAMERA SYSTEM

(71) Applicant: Panasonic Intellectual Property Management Co., Ltd., Osaka (JP)

(72) Inventors: Makoto Shouho, Osaka (JP); Masashi Murakami, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/144,989

(22) Filed: Sep. 27, 2018

(65) Prior Publication Data

US 2019/0116327 A1    Apr. 18, 2019

(30) Foreign Application Priority Data

Oct. 16, 2017 (JP) ................... 2017-200540

(51) Int. Cl.
*H04N 5/365* (2011.01)
*H01L 27/146* (2006.01)
*H04N 5/3745* (2011.01)
*H04N 5/369* (2011.01)
*H04N 5/378* (2011.01)

(52) U.S. Cl.
CPC ....... *H04N 5/365* (2013.01); *H01L 27/14612* (2013.01); *H01L 27/14643* (2013.01); *H04N 5/3698* (2013.01); *H04N 5/378* (2013.01); *H04N 5/37457* (2013.01)

(58) Field of Classification Search
CPC ...... H04N 5/365; H04N 5/378; H04N 5/3698; H04N 5/37457; H01L 27/14612; H01L 27/14643
See application file for complete search history.

(56) References Cited

U.S. PATENT DOCUMENTS

| 2007/0023788 | A1 | 2/2007 | Yasui et al. |
| 2009/0231478 | A1 | 9/2009 | Shinohara |
| 2010/0053389 | A1* | 3/2010 | Matsuura ............... H04N 5/355 348/294 |
| 2015/0288898 | A1* | 10/2015 | Yazawa ................. H04N 5/363 348/300 |
| 2015/0326812 | A1 | 11/2015 | Sakuragi |

FOREIGN PATENT DOCUMENTS

| JP | 2007-036916 | 2/2007 |
| JP | 2009-225004 | 10/2009 |
| JP | 2012-109888 | 6/2012 |
| JP | 2015-216434 | 12/2015 |

* cited by examiner

*Primary Examiner* — Padma Haliyur
(74) *Attorney, Agent, or Firm* — McDermott Will & Emery LLP

(57) ABSTRACT

An imaging device provided with: a pixel including a photoelectric converter that converts light into charges, the pixel outputting a first signal corresponding to an amount of the charges; an output signal line coupled to the pixel, the first signal being transmitted through the output signal line; a load transistor having a source, a drain, and a gate, one of the source and the drain being coupled to the output signal line; and a voltage supply circuit coupled to the gate of the load transistor, the voltage supply circuit selectively supplying either a first voltage or a second voltage to the gate.

19 Claims, 9 Drawing Sheets

IMAGING DEVICE INCLUDING OUTPUT SIGNAL LINE AND LOAD TRANSISTOR AND CAMERA SYSTEM

BACKGROUND

1. Technical Field

The present disclosure relates to an imaging device and a camera system.

2. Description of the Related Art

High-resolution imaging devices have been proposed in recent years. In high-resolution imaging devices, noise reduction is desired more than in the past. Japanese Unexamined Patent Application Publication No. 2009-225004 discloses an imaging device that has a sample-and-hold circuit. In the imaging device described in Japanese Unexamined Patent Application Publication No. 2009-225004, noise from a voltage generation unit being superimposed on pixel signals is suppressed by setting sampling and holding to off.

SUMMARY

Imaging devices having reduced noise are in demand.

In one general aspect, the techniques disclosed here feature an imaging device provided with: a pixel including a photoelectric converter that converts light into charges, the pixel outputting a first signal corresponding to an amount of the charges; an output signal line coupled to the pixel, the first signal being transmitted through the output signal line; a load transistor having a source, a drain, and a gate, one of the source and the drain being coupled to the output signal line; and a voltage supply circuit coupled to the gate of the load transistor, the voltage supply circuit selectively supplying either a first voltage or a second voltage to the gate.

General or specific aspects may be realized by means of an element, a device, a module, a system, an integrated circuit, or a method. Furthermore, general or specific aspects may be realized by means of an arbitrary combination of an element, a device, a module, a system, an integrated circuit, and a method.

Additional benefits and advantages of the disclosed embodiments will be apparent from the specification and figures. The benefits and/or advantages may be individually provided by the various embodiments or features disclosed in the specification and figures, and need not all be provided in order to obtain one or more of the same.

DETAILED DESCRIPTION (Underlying Knowledge Forming Basis of the Present Disclosure)

Generally, noise generated from a solid-state imaging device can be broadly divided into horizontal noise and vertical noise according to the types thereof. In addition, horizontal noise and vertical noise are each caused by FPN (fixed-pattern noise) and random noise.

The pixels in which FPN is generated are determined for each device. Therefore, noise patterns are retained in a device in advance, images are corrected whenever captured by a DSP (digital signal processor) or the like coupled at a stage subsequent to the imaging device, and thus the majority of noise can be removed.

In contrast, with random noise, the position and level at which noise is generated are random each time an image is captured. Horizontal noise therefore cannot be corrected with a method similar to that for FPN. In particular, it is difficult to correct horizontal random noise even with pixels that are located in the same row because the pixels are coupled to respectively different vertical signal lines. Therefore, a reduction in the absolute quantity of horizontal random noise or an effective correction method is desired.

Imaging devices that have amplification transistors within pixels are conventionally known. In the case where a pixel has an amplification transistor, it is common for a constant current to be supplied to the amplification transistor in order to bring about a source follower operation. A configuration is therefore known in which a constant current is supplied to an amplification transistor from a load transistor that is a MOS transistor for supplying a constant current and is coupled to a vertical output line. In this kind of configuration, for example, a constant voltage is supplied to the gates of a plurality of load transistors from a voltage supply circuit. Furthermore, the voltage supply circuit is configured using transistors.

Figure 9:
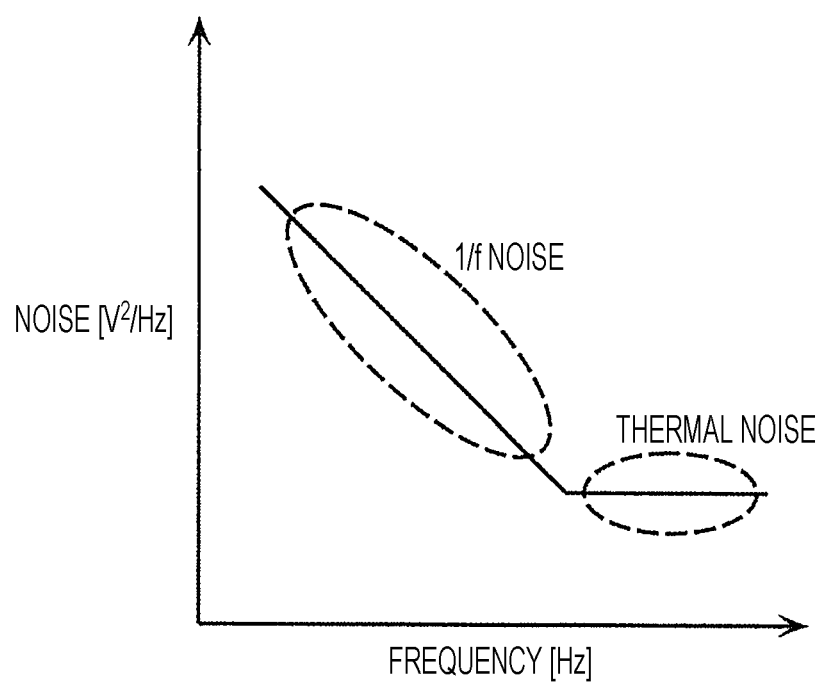
FIG. 9 is a drawing depicting frequency dependence of circuit noise.

FIG. 9 is a drawing depicting frequency dependence of circuit noise. It is known that 1/f noise and thermal noise are commonly produced in transistor circuits, as depicted in FIG. 9. 1/f noise has the property of the power spectrum thereof being proportional to the inverse of the frequency f of the circuit during operation. With thermal noise, the power spectrum thereof is constant with respect to the frequency. These types of noise cause temporal fluctuations in the potential of voltage supply wiring. As depicted in FIG. 9, 1/f noise is dominant in the low-frequency region and thermal noise is dominant in the high-frequency region.

1/f noise generated by the transistors constituting the voltage supply circuit is transmitted to the load transistors, which are provided corresponding respectively to a plurality of vertical signal lines. Furthermore, each of a plurality of pixels that are arranged in the same row is coupled to a corresponding vertical signal line at a certain point in time, and pixel signals are read out by means of the constant current supplied by the load transistors. Consequently, the 1/f noise transmitted to each load transistor at the certain point in time affects the pixel signals of the plurality of pixels arranged in the same row that are read out at that point in time, thereby generating horizontal noise. Specifically, in the imaging device described in Japanese Unexamined Patent Application Publication No. 2009-225004, there is a transistor that is constantly coupled to voltage supply wiring. There is a possibility of noise generated by that transistor being superimposed on a pixel signal.

In the present disclosure, in light of the aforementioned problems, a description will be given regarding an imaging device with which the generation of horizontal noise can be reduced.

A summary of the present disclosure is as follows.

[Item 1] An imaging device provided with:
a pixel including a photoelectric converter that converts light into charges, the pixel outputting a first signal corresponding to an amount of the charges;
an output signal line coupled to the pixel, the first signal being transmitted through the output signal line;
a load transistor having a source, a drain, and a gate, one of the source and the drain being coupled to the output signal line; and
a voltage supply circuit coupled to the gate of the load transistor, the voltage supply circuit selectively supplying either a first voltage or a second voltage to the gate.

[Item 2] The imaging device according to item 1, further provided with
a control circuit that causes the voltage supply circuit to selectively supply either the first voltage or the second voltage to the gate.

[Item 3] The imaging device according to item 1, in which the voltage supply circuit includes a switching circuit that switches between generating the first voltage and generating the second voltage.

[Item 4] The imaging device according to item 1, in which the voltage supply circuit includes:
a voltage generator that generates a third voltage;
a first amplification circuit coupled to the voltage generator, the first amplification circuit amplifying the third voltage to generate a first current;
a second amplification circuit coupled to the voltage generator, the second amplification circuit amplifying the third voltage to generate a second current; and
a resistance circuit coupled to the gate, the resistance circuit generating the first voltage from the first current, the resistance circuit generating the second voltage from the second current.

[Item 5] The imaging device according to item 4, in which
the first amplification circuit includes a first transistor having a gate coupled to the voltage generator,
the second amplification circuit includes a second transistor having a gate coupled to the voltage generator, and
a ratio of a channel width of the first transistor with respect to a channel length of the first transistor is equal to a ratio of a channel width of the second transistor with respect to a channel length of the second transistor.

[Item 6] The imaging device according to claim 4 or 5, in which
the voltage supply circuit includes:
a third transistor coupled in series to the first amplification circuit; and
a fourth transistor coupled in series to the second amplification circuit, and
either the third transistor or the fourth transistor is selectively caused to be on.

[Item 7] The imaging device according to item 1, in which the voltage supply circuit includes:

a voltage generator that generates a third voltage;
an amplification circuit coupled to the voltage generator, the amplification circuit amplifying the third voltage to generate a first current;
a first resistance circuit that generates the first voltage from the first current; and
a second resistance circuit that generates the second voltage from the first current.

[Item 8] The imaging device according to item 7, in which
the first resistance circuit includes a first transistor one of a source and a drain of which is coupled to the gate of the load transistor,
the second resistance circuit includes a second transistor one of a source and a drain of which is coupled to the gate of the load transistor, and
a ratio of a channel width of the first transistor with respect to a channel length of the first transistor is equal to a ratio of a channel width of the second transistor with respect to a channel length of the second transistor.

[Item 9] The imaging device according to item 7 or 8, in which
the voltage supply circuit includes:
a third transistor coupled in series to the first resistance circuit; and
a fourth transistor coupled in series to the second resistance circuit, and
either the third transistor or the fourth transistor is selectively caused to be on.

[Item 10] The imaging device according to item 1, in which the voltage supply circuit includes:
a voltage generator that generates a third voltage;
a first amplification circuit coupled to the voltage generator, the first amplification circuit amplifying the third voltage to generate a first current;
a first resistance circuit that generates the first voltage from the first current;
a second amplification circuit coupled to the voltage generator, the second amplification circuit amplifying the third voltage to generate a second current; and
a second resistance circuit that generates the second voltage from the second current.

[Item 11] The imaging device according to item 10, in which
the first amplification circuit includes a first transistor having a gate coupled to the voltage generator,
the first resistance circuit includes a second transistor one of a source and a drain of which is coupled to the gate of the load transistor,
the second amplification circuit includes a third transistor having a gate coupled to the voltage generator, and
the second resistance circuit includes a fourth transistor one of a source and a drain of which is coupled to the gate of the load transistor.

[Item 12] The imaging device according to item 11, in which
a ratio of a channel width of the first transistor with respect to a channel length of the first transistor is greater than a ratio of a channel width of the third transistor with respect to a channel length of the third transistor, and
a ratio of a channel width of the second transistor with respect to a channel length of the second transistor is greater than a ratio of a channel width of the fourth transistor with respect to a channel length of the fourth transistor.

[Item 13] The imaging device according to item 11, in which
a ratio of a channel width of the first transistor with respect to a channel length of the first transistor is less than a ratio of a channel width of the third transistor with respect to a channel length of the third transistor, and a ratio of a channel width of the second transistor with respect to a channel length of the second transistor is less than a ratio of a channel width of the fourth transistor with respect to a channel length of the fourth transistor.

[Item 14] The imaging device according to any one of items 1 to 13, in which the voltage supply circuit switches between the first voltage and the second voltage one or more times in one horizontal period.

[Item 15] The imaging device according to item 14, further provided with a sample-and-hold circuit coupled to the output signal line, the sample-and-hold circuit reading out and retaining the first signal, in which the pixel outputs a second signal to the output signal line in a state where the charges have been reset, and the voltage supply circuit
supplies the first voltage in a first period including a period when the sample-and-hold circuit reads out the first signal,
supplies the first voltage in a second period including a period when the sample-and-hold circuit reads out the second signal, and
supplies the second voltage in a third period different from either of the first period and the second period.

[Item 16] The imaging device according to item 15, in which, in the one horizontal period, the third period is located between the first period and the second period.

[Item 17] The imaging device according to item 15, in which, in the one horizontal period, the first period and the second period are consecutive.

[Item 18] An imaging device provided with:

a pixel that includes a photoelectric converter for converting light into charges, and outputs a first signal corresponding to an amount of the charges;

an output signal line coupled to the pixel, the first signal being transmitted through the output signal line;

a first load transistor having a first source, a first drain, and a first gate;

a second load transistor having a second source, a second drain, and a second gate;

a voltage supply circuit that supplies a first voltage to the first gate and the second gate; and a switching circuit that switches between coupling one of the first source and the first drain to the output signal line and coupling one of the second source and the second drain to the output signal line.

[Item 19] The imaging device according to item 18, further provided with a control circuit that causes the switching circuit to switch between coupling one of the first source and the first drain to the output signal line and coupling one of the second source and the second drain to the output signal line.

[Item 20] The imaging device according to item 18, in which the ratio of the channel width of the first load transistor with respect to the channel length of the first load transistor is equal to the ratio of the channel width of the second load transistor with respect to the channel length of the second load transistor.

[Item 21] The imaging device according to item 18 or 19, in which the switching circuit includes:
a first transistor coupled in series to the first load transistor; and
a second transistor coupled in series to the second load transistor.

[Item 22] A camera system provided with the imaging device according to any one of items 1 to 21.

An imaging device according to an aspect of the present disclosure is provided with: a pixel that is provided with a photoelectric converter that converts light into charges and an amplification transistor that outputs a first signal corresponding to the charges; an output signal line to which the first signal is output from the pixel; a load transistor that is coupled to the output signal line and supplies a first current to the output signal line; a voltage supply circuit that supplies a first voltage and a second voltage to a gate of the load transistor; voltage supply wiring that electrically couples the voltage supply circuit and the gate of the load transistor; and a control circuit that controls the voltage supply circuit, in which the voltage supply circuit includes a first circuit that converts a current into the first voltage and a second circuit that converts the current into the second voltage, and the control circuit switches between converting the current into the first voltage using the first circuit and supplying the first voltage to the gate of the load transistor, and converting the current into the second voltage using the second circuit and supplying the second voltage to the gate of the load transistor.

Accordingly, the circuit that is used to generate a voltage to be supplied to the load transistor can be switched between the first circuit and the second circuit. Thus, the drive frequencies of transistors of the first circuit and the second circuit can be increased, and it is therefore possible to reduce the effect of 1/f noise that is superimposed on the voltages supplied to the load transistor. Thus, horizontal noise can be reduced.

For example, the voltage supply circuit may be provided with a voltage generation unit that generates a third voltage, the first circuit may include a first amplification circuit that is electrically coupled to the voltage generation unit and converts the third voltage into a second current, the second circuit may include a second amplification circuit that is electrically coupled to the voltage generation unit and converts the third voltage into a third current, and the voltage supply circuit may be provided with a resistance circuit that is electrically coupled to the voltage supply wiring, and converts the second current into the first voltage and outputs the first voltage to the voltage supply wiring, or converts the third current into the second voltage and outputs the second voltage to the voltage supply wiring.

Accordingly, a configuration can be realized in which the circuit that is used to generate a voltage to be supplied to the load transistor is switched, while suppressing an increase in the circuit area.

For example, the first amplification circuit may be provided with a first transistor having a gate to which the second voltage is supplied, the second amplification circuit may be provided with a second transistor having a gate to which the second voltage is supplied, and the ratio of the channel width with respect to the channel length of the first transistor may be equal to the ratio of the channel width with respect to the channel length of the second transistor.

Accordingly, it is possible to suppress changes in the voltage to be supplied to the load transistor, produced when the circuit that is used to generate the voltage is switched.

For example, the voltage supply circuit may be provided with a third transistor that is coupled in series to the first amplification circuit, and a fourth transistor that is coupled in series to the second amplification circuit, and the control circuit may switch the transistor that is to be set to on out of the third transistor and the fourth transistor.

Accordingly, the circuit that is used to generate the voltage to be supplied to the load transistor can be switched by switching transistors to be on or off.

For example, the voltage supply circuit may be provided with a voltage generation unit that generates a third voltage, and an amplification circuit that is electrically coupled to the voltage generation unit and amplifies the third voltage to generate a second current, the first circuit may include a first resistance circuit that converts the second current into the first voltage, and the second circuit may include a second resistance circuit that converts the second current into the second voltage.

Accordingly, a configuration can be realized in which the circuit that is used for the voltage to be supplied to the load transistor is switched, while suppressing an increase in the circuit area.

For example, the first resistance circuit may be provided with a first transistor having one of a source and a drain coupled to the voltage supply wiring, the second resistance circuit may be provided with a second transistor having one of a source and a drain coupled to the voltage supply wiring, and the ratio of r channel width with respect to the channel length of the first transistor may be equal to the ratio of the channel width with respect to the channel length of the second transistor.

Accordingly, it is possible to suppress changes in the voltage to be supplied to the load transistor, produced when the circuit that is used to generate the voltage is switched.

For example, the voltage supply circuit may be additionally provided with a third transistor that is coupled in series to the first resistance circuit, and a fourth transistor that is coupled in series to the second resistance circuit, and the control circuit may switch the transistor that is to be set to on out of the third transistor and the fourth transistor.

Accordingly, the circuit that is used to generate the voltage to be supplied to the load transistor can be switched by switching transistors to be on or off.

For example, the voltage supply circuit may be provided with a voltage generation unit that generates a third voltage, the first circuit may include a first amplification circuit that is electrically coupled to the voltage generation unit and amplifies and converts the third voltage into a second current, and a first resistance circuit that converts the second current into the first voltage, and the second circuit may include a second amplification circuit that is electrically coupled to the voltage generation unit and amplifies and converts the third voltage into a third current, and a second resistance circuit that converts the third current into the second voltage.

Accordingly, 1/f noise generated by the amplification circuits and the resistance circuits can be suppressed, and therefore 1/f noise can be further suppressed.

For example, the first amplification circuit may be provided with a first transistor having a gate to which the third voltage is supplied, the first resistance circuit may be provided with a second transistor having one of a source and a drain coupled to the voltage supply wiring, the second amplification circuit may be provided with a third transistor having a gate to which the third voltage is supplied, and the second resistance circuit may be provided with a fourth transistor having one of a source and a drain coupled to the voltage supply wiring.

For example, the ratio of the channel width with respect to the channel length of the first transistor may be greater than the ratio of the channel width with respect to the channel length of the third transistor, and the ratio of the channel width with respect to the channel length of the second transistor may be greater than the ratio of the channel width with respect to the channel length of the fourth transistor.

Accordingly, the driving capabilities of the first circuit and the second circuit can be varied, and the difference between the first voltage generated by the first circuit and the second voltage generated by the second circuit can be reduced.

For example, the ratio of the channel width with respect to the channel length of the first transistor may be less than the ratio of the channel width with respect to the channel length of the third transistor, and the ratio of the channel width with respect to the channel length of the second transistor may be less than the ratio of the channel width with respect to the channel length of the fourth transistor.

Accordingly, the driving capabilities of the first circuit and the second circuit can be varied, and the difference between the first voltage generated by the first circuit and the second voltage generated by the second circuit can be reduced.

For example, the control circuit may switch, one or more times in each horizontal period, between converting the current into the first voltage using the first circuit and supplying the first voltage to the gate of the load transistor, and converting the current into the second voltage using the second circuit and supplying the second voltage to the gate of the load transistor.

Accordingly, the drive frequencies of transistors of the first circuit and the second circuit can be increased, and it is therefore possible to reduce the effect of 1/f noise that is superimposed on the voltages supplied to the load transistor.

For example, the imaging device may be provided with a sample-and-hold circuit that is coupled to the output signal line and retains the first signal, the control circuit may control the voltage supply circuit in such a way that, in a first period, the voltage supply circuit generates the first voltage using the first circuit, and, in a second period other than the first period, the voltage supply circuit generates the first voltage using the second circuit, and the first period may include a third period in which the sample-and-hold circuit reads out the first signal.

Accordingly, a voltage to be supplied to the load transistor can be generated using circuits that are different in a first period in which a signal is acquired by the sample-and-hold circuit and in a second period that is different from the first period. Thus, circuits having properties that are suitable for each operation can be used in each period, for example.

For example, in the imaging device, the pixel may output a second signal to the output signal line in a state in which the pixel has been reset, the control circuit may control the voltage supply circuit in such a way that, in a third period that is different from the first period, the voltage supply circuit generates the first voltage using the first circuit, the third period may include a period in which the sample-and-hold circuit reads out the second signal, and the second period may include a period between the first period and the third period.

Accordingly, the drive frequencies of transistors of the first circuit and the second circuit can be increased, and it is therefore possible to further reduce the effect of 1/f noise that is superimposed on the voltages supplied to the load transistor.

For example, in the imaging device, the pixel may output a second signal to the output signal line in a state in which the pixel has been reset, and the first period may be constituted by consecutive periods including a period in which the sample-and-hold circuit reads out the first signal and a period in which the sample-and-hold circuit reads out the second signal.

Accordingly, the drive frequencies of transistors of the first circuit and the second circuit can be appropriately set, and it is therefore possible to suppress an increase in noise caused by the drive frequencies increasing.

An imaging device according to an aspect of the present disclosure is an imaging device that is provided with: a plurality of pixels that are provided with a photoelectric converter that converts light into charges, and an amplification transistor that outputs a first signal corresponding to the charges; a plurality of output signal lines to which the first signal is output from the pixels; and a load circuit that is coupled to the output signal lines and supplies a first current to the output signal lines, the load circuit including a first load transistor and a second load transistor, the imaging device being further provided with: a voltage supply circuit that supplies a first voltage to a gate of the first load transistor and a gate of the second load transistor; voltage supply wiring that electrically couples the voltage supply circuit with the gate of the first load transistor and the gate of the second load transistor; and a control circuit that controls the plurality of load circuits, and the control circuit selectively electrically coupling either of the first load transistor and the second load transistor to the output signal lines.

Accordingly, the drive frequencies of transistors of the first circuit and the second circuit can be increased by switching the load transistor to be used. Thus, the 1/f noise of the load transistors can be reduced. Consequently, the horizontal noise of the imaging device can be suppressed.

For example, the ratio of the channel width with respect to the channel length of the first load transistor may be equal to the ratio of the channel width with respect to the channel length of the second load transistor.

Accordingly, it is possible to suppress changes in the first current produced when the load transistor to be used is switched.

For example, the load circuit may be provided with a first transistor that is coupled in series to the first load transistor, and a second transistor that is coupled in series to the second load transistor.

Accordingly, the load transistor to be used can be switched by switching transistors to be on or off.

A camera system according to an aspect of the present disclosure is provided with the imaging device.

Accordingly, the drive frequencies of transistors of the first circuit and the second circuit can be increased, and it is therefore possible to reduce the effect of 1/f noise that is superimposed on the voltages supplied to the load transistor. Thus, the horizontal noise of the imaging device can be suppressed.

Hereinafter, embodiments of the present disclosure will be described in detail with reference to the drawings. It should be noted that the embodiments described hereinafter all represent general or specific examples. The numerical values, the shapes, the materials, the constituent elements, the arrangement and mode of connection of the constituent elements, the steps, the order of the steps, and the like given in the following embodiments are examples and are not intended to restrict the present disclosure. The various aspects described in the present specification may be combined with each other provided there are no resulting inconsistencies. Furthermore, from among the constituent elements in the following embodiments, constituent elements that are not mentioned in the independent claims indicating the most significant concepts are described as optional constituent elements. In the following description, constituent elements having substantially the same functions are denoted by common reference numerals, and descriptions thereof have been omitted.

First Embodiment

Figure 1:
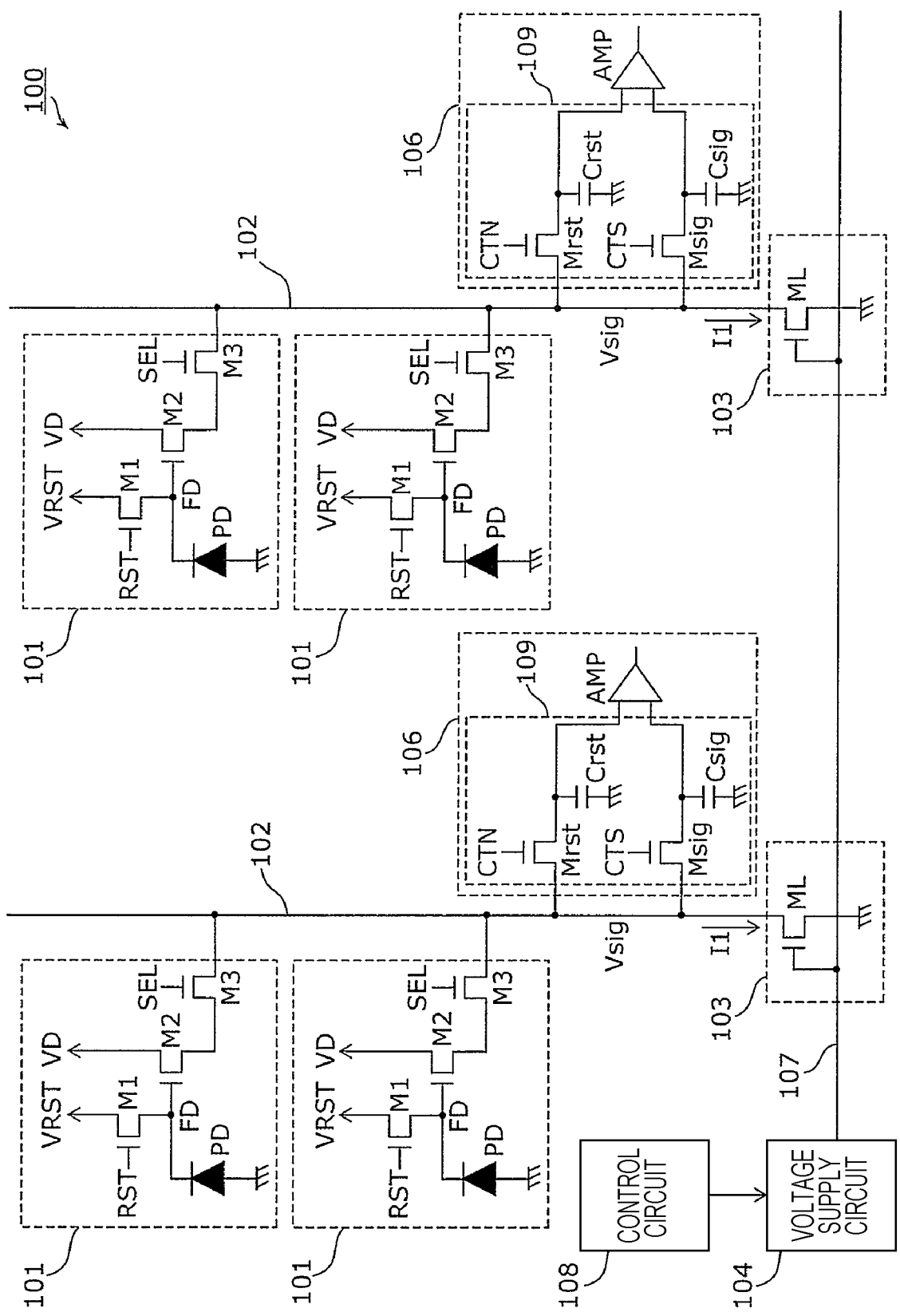
FIG. 1 is a drawing depicting the configuration of an imaging device according to a first embodiment.

First, the configuration of an imaging device 100 according to the present embodiment will be described. FIG. 1 is a drawing depicting a circuit configuration of the imaging device 100 according to the present embodiment.

The imaging device 100 is provided with a plurality of pixels 101 arrayed in a matrix form, a plurality of vertical signal lines 102, and peripheral circuits. In practice, several million pixels 101 may be arrayed in a matrix form. To simplify the drawings, FIG. 1 depicts only the pixels 101 of two rows and two columns. It should be noted that the imaging device 100 may be a line sensor. In such a case, the plurality of pixels 101 are arrayed in the row direction or the column direction.

The peripheral circuits include a plurality of load circuits 103, a voltage supply circuit 104, a plurality of column signal processing circuits 106, voltage supply wiring 107, a control circuit 108, an analog-digital conversion circuit (not depicted), a row scanning circuit (not depicted), a column scanning circuit (not depicted), and the like. The peripheral circuits mainly read out and process pixel signals from the pixels 101, and output these to outside of the imaging device 100. Hereinafter, the analog-digital conversion circuit will be referred to as an AD conversion circuit.

The vertical signal lines 102 are output signal lines that are provided in each column. The column signal processing circuits 106 are arranged in each column or each plurality of columns, and are coupled to the vertical signal line 102 arranged in the corresponding column. Each column signal processing circuit 106 includes a sample-and-hold circuit 109 and a differential amplifier AMP.

The pixels 101 and the sample-and-hold circuits 109 are electrically coupled via the vertical signal lines 102 provided in the corresponding columns. Reference signals and pixel signals that are output from the pixels 101 are sampled by the sample-and-hold circuits 109. The differential amplifiers AMP output the differences between sampled reference signals and pixel signals. True pixel signals can thereby be obtained.

The AD conversion circuit subjects the true pixel signals that are output from the differential amplifiers AMP to AD conversion to generate digital signals. The imaging device 100 may output raw data, for example, as pixel signals.

The pixels 101, for example, have a photoelectric conversion unit PD, a reset transistor M1, an amplification transistor M2, and a selection transistor M3.

The photoelectric conversion unit PD is a photodiode, for example. It should be noted that the photoelectric conversion unit PD may include a photoelectric conversion layer arranged between two electrodes, formed on a semiconductor substrate. The photoelectric conversion layer may include an organic photoelectric conversion material and amorphous silicon, for example. The photoelectric conversion unit PD generates signal charges by means of photoelectric conversion in which light is converted into charges. The photoelectric conversion unit PD is electrically coupled to the reset transistor M1 and the amplification transistor M2. A node electrically couples the photoelectric conversion unit PD, the reset transistor M1, and the amplification transistor M2, and this node is generally called a floating diffusion (FD) node. Signal charges obtained by photoelectric conversion by the photoelectric conversion unit PD is accumulated in the FD node.

The reset transistor M1 resets the potential of the FD node. The amplification transistor M2 outputs a signal corresponding to the charges generated by the photoelectric conversion unit PD to a vertical signal line 102. Specifically, the amplification transistor M2 outputs a voltage corresponding to the amount of the charges generated by the photoelectric conversion unit PD. The selection transistor M3 controls whether or not a signal is output from the amplification transistor M2 to the vertical signal line 102. The amplification transistor M2 forms a source follower circuit with a load transistor ML described hereinafter.

A load circuit 103 is arranged in each column and is coupled to the vertical signal line 102 arranged in the corresponding column. This load circuit 103 includes the load transistor ML. One of the source and drain of the load transistor ML is coupled to the vertical signal line 102 arranged in the corresponding column. The load transistor ML supplies a constant current I1 to the vertical signal line 102 arranged in the corresponding column.

Furthermore, the gates of the plurality of load transistors ML are coupled to the common voltage supply wiring 107. A voltage V2 or a voltage V3 is supplied to the gates of the plurality of load transistors ML via the voltage supply wiring 107 from the voltage supply circuit 104 described hereinafter.

The column signal processing circuit 106 functions as a CDS circuit for suppressing noise signals of the pixels 101.

The sample-and-hold circuit 109 is provided with a switch Mrst, a switch Msig, a capacitance Crst, and a capacitance Csig. The capacitance Crst retains a reference signal. The capacitance Csig retains a pixel signal. The switch Mrst and the switch Msig are each transistors, for example. The switch Mrst is coupled between the vertical signal line 102 and the capacitance Crst, and on and off are controlled according to a signal CTN. The switch Msig is coupled between the vertical signal line 102 and the capacitance Csig, and on and off are controlled according to a signal CTS.

Here, a pixel signal is a signal that corresponds to an amount of the charges obtained by photoelectric conversion by the photoelectric conversion unit PD. A reference signal is a signal that is output when a pixel 101 has been reset.

The differential amplifier AMP is a differential operational amplification circuit, for example, and outputs a signal that corresponds to the difference between a pixel signal and a reference signal. Noise that is included in the signal that is output can thereby be reduced. It should be noted that a CDS circuit may be included in the column signal processing circuit 106, or may be provided outside of the imaging device 100.

Furthermore, the voltage V2 or the voltage V3 that is generated by the voltage supply circuit 104 described hereinafter may be used as a voltage for causing the column signal processing circuit 106 to operate. The differential amplifier AMP may include a MOS transistor, for example, and the voltage V2 or the voltage V3 may be applied to the gate of the MOS transistor.

The voltage supply circuit 104 supplies the voltage V2 or the voltage V3 to the plurality of load transistors ML. As previously mentioned, the voltage supply circuit 104 may supply the voltage V2 or the voltage V3 to the plurality of column signal processing circuits 106. Only one voltage supply circuit 104 may be provided for the imaging device 100 or a plurality may be provided. For example, a plurality of column signal processing circuits 106 may be arranged in positions that oppose each other with the pixel array arranged therebetween. In this case, voltage supply circuits 104 that supply voltages to the column signal processing circuits 106 may be provided in positions that oppose each other with the pixel array arranged therebetween. The voltage supply wiring 107 electrically couples the voltage supply circuit 104 and the gates of the plurality of load transistors ML. The voltage V2 or the voltage V3 is supplied to the load transistors ML from the voltage supply circuit 104 via the voltage supply wiring 107.

The control circuit 108 inputs a signal to a transistor within the voltage supply circuit 104, and controls the voltage supply circuit 104.

Figure 2:
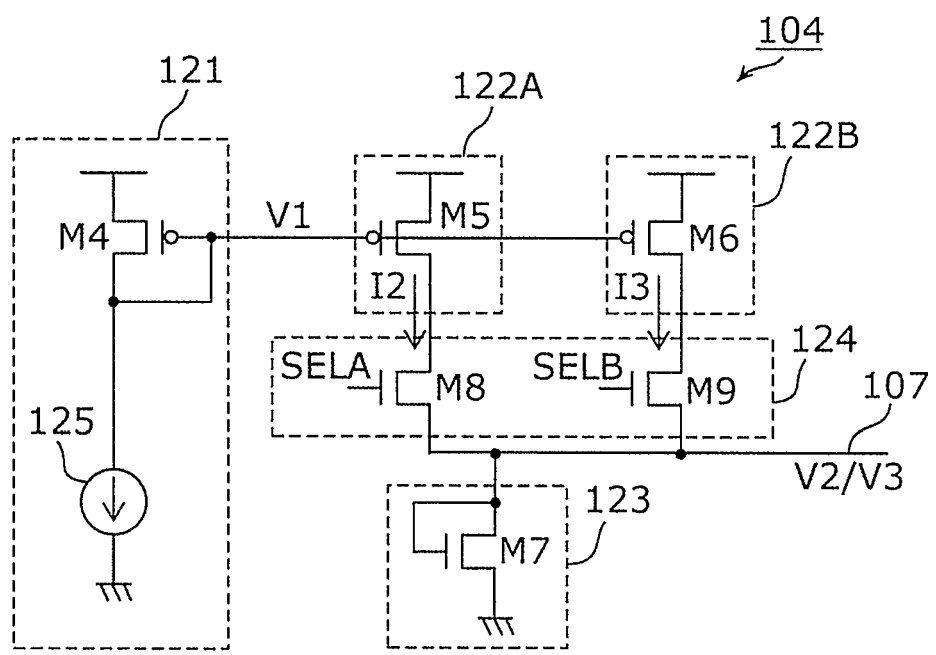
FIG. 2 is a drawing depicting the configuration of a voltage supply circuit according to the first embodiment.

Next, the configuration of the voltage supply circuit 104 will be described. FIG. 2 is a circuit diagram depicting an exemplary configuration of the voltage supply circuit 104. The voltage supply circuit 104 includes a voltage generation unit 121, an amplification circuit 122A and amplification circuit 122B, a resistance circuit 123, and a switching circuit 124.

The voltage generation unit 121 generates a voltage V1 that is a constant voltage. The voltage generation unit 121 is provided with a transistor M4 and a constant current source 125. In the transistor M4, the gate and the drain are short-circuited. The constant current source 125 is coupled to the gate and the drain of the transistor M4. The constant current source 125 is a constant current generation circuit, for example.

The amplification circuit 122A is electrically coupled to the voltage generation unit 121. The amplification circuit 122A is provided with a transistor M5 the gate of which is electrically coupled to the voltage generation unit 121. The voltage V1 is input from the voltage generation unit 121 to the gate of the transistor M5. The transistor M5 amplifies and converts the voltage V1 into a current I2.

The amplification circuit 122B is electrically coupled to the voltage generation unit 121. The amplification circuit 122B is provided with a transistor M6 the gate of which is electrically coupled to the voltage generation unit 121. The voltage V1 is input from the voltage generation unit 121 to the gate of the transistor M6. The transistor M6 amplifies and converts the voltage V1 into a current I3.

The resistance circuit 123 is electrically coupled to the voltage supply wiring 107. The resistance circuit 123 is provided with a transistor M7. The gate and the drain of the transistor M7 are coupled to each other. The current I2 or the current I3 is input to the drain of the transistor M7. The transistor M7 converts the current I2 that flows between the source and drain into the voltage V2, or converts the current I3 into the voltage V3. The voltage V2 or the voltage V3 obtained by the conversion by the transistor M7 is applied to the gate of the load transistor ML via the voltage supply wiring 107. It should be noted that the voltage V2 and the voltage V3 may be different values or may be the same values.

The switching circuit 124 is provided with a transistor M8 and a transistor M9. The transistor M8 is coupled in series to the transistor M5. Specifically, the drain of the transistor M5 and the drain of the transistor M8 are coupled to each other. The transistor M9 is coupled in series to the transistor M6. Specifically, the drain of the transistor M6 and the drain of the transistor M9 are coupled to each other. The switching circuit 124 switches between which of the amplification circuit 122A and the amplification circuit 122B is coupled to the resistance circuit 123.

The transistor M4 and the transistor M5 form a current mirror circuit due to the source voltages and the gate voltages thereof being made common. The transistor M4 and the transistor M6 form a current mirror circuit in a similar manner.

The sources of the transistor M8 and the source of the transistor M9 are electrically coupled to the drain and the gate of the transistor M7. A signal SELA is supplied to the gate of the transistor M8. A signal SELB is supplied to the gate of the transistor M9. In a case where the signal SELA is high, the current mirror circuit formed by the transistor M4 and the transistor M5 is selected. In a case where the signal SELB is high, the current mirror circuit formed by the transistor M4 and the transistor M6 is selected.

The signal SELA and the signal SELB are generated by the control circuit 108. The control circuit 108 sets the signal SELA and the signal SELB in such a way that when one is high, the other is low. That is, the control circuit 108 controls the voltage supply circuit 104 in such a way that one of the transistor M8 and the transistor M9 is on and the other is off. The control circuit 108 then switches the transistor that is on out of the transistor M8 and the transistor M9, and thereby switches which of the current I2 and the current I3 is supplied to the resistance circuit 123. That is, the control circuit 108 switches whether the voltage V1 is converted into the current I2 using the amplification circuit 122A, or whether the voltage V1 is converted into the current I3 using the amplification circuit 122B.

Figure 3:
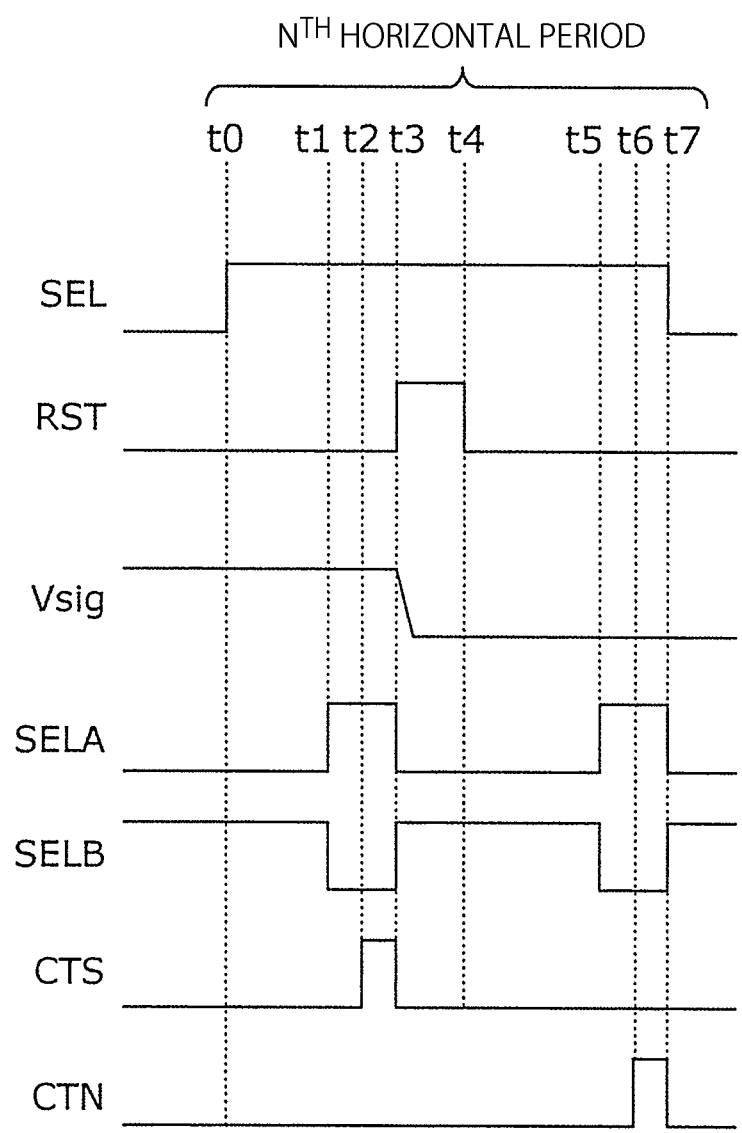
FIG. 3 is a timing chart depicting an operation of the imaging device according to the first embodiment.

Next, an operation of the imaging control device 100 will be described. FIG. 3 is a timing chart depicting an operation during one horizontal period of the imaging device 100. One horizontal period is a period in which signals are read out from pixels belonging to one row.

A control signal SEL is supplied to the gate of the selection transistor M3 from the control circuit 108. A control signal RST is supplied to the gate of the reset transistor M1 from the control circuit 108. A control signal CTN is supplied to the gate of the transistor Mrst from the control circuit 108. A control signal CTS is supplied to the transistor Msig from the control circuit 108. A voltage Vsig represents a voltage of a vertical signal line 102.

At time t0, the signal SEL becomes high and an operation to read out signals from the pixels 101 is started. At time t0, the signal SELA is low, and the signal SELB is high. That is, the voltage V3 converted using the amplification circuit 122B is supplied to the voltage supply wiring 107. Specifically, an output voltage V3 from a current mirror circuit formed by the transistors M6, M9, and M7 is applied to the voltage supply wiring 107.

At time t1, the signal SELA becomes high and the signal SELB becomes low. Thus, the voltage V2 converted using the amplification circuit 122A is supplied to the voltage supply wiring 107. Specifically, an output voltage V2 from a current mirror circuit formed by the transistors M5, M8, and M7 is applied to the voltage supply wiring 107.

At time t2, the signal CTS becomes high. Thus, an operation to sample and hold pixel signals from the pixels 101 in the capacitance Csig is started.

At time t3, the control signal CTS becomes low and the operation to sample and hold pixel signals in the capacitance Csig ends. At the same time, the signal SELA becomes low and the signal SELB becomes high. Thus, the voltage V3 converted using the amplification circuit 122B is once again supplied to the voltage supply wiring 107.

Furthermore, between time t3 and time t4, the signal RST becomes high and the charges accumulated in the FD nodes of the pixels 101 are reset.

At time t5, once again the signal SELA becomes high and the signal SELB becomes low. Thus, the voltage V2 converted using the amplification circuit 122A is supplied to the voltage supply wiring 107.

Between time t6 and time t7, the signal CTN becomes high and reference signals from the pixels 101 are sampled and held in the capacitance Crst.

At time t7, the signal SELA becomes low and the signal SELB becomes high. Thus, the voltage V3 converted using the amplification circuit 122B is supplied to the voltage supply wiring 107.

In the driving scheme depicted in FIG. 3, the signal SELA becomes high only in the period t2 to t3 in which the control signal CTS is high, the immediately preceding period t1 to t2, the period t6 to t7 in which the control signal CTN is high, and the immediately preceding period t5 to t6, and the signal SELB becomes high in the other periods of t0 to t1 and t3 to t5. That is, the voltage V2 converted using the amplification circuit 122A is supplied to the voltage supply wiring 107 only when pixel signals and reference signals are read out and in the immediately preceding periods. However, the voltage V3 converted using the amplification circuit 122B is supplied to the voltage supply wiring 107 in the other periods of t0 to t1 and t3 to t5. For example, a case is assumed where a period in which the signal SELA is set to high is ¼ of one horizontal period. The drive frequency of the amplification circuit 122A in this case becomes four times greater compared to a case where the signal SELA is constantly high. That is, the 1/f noise generated by the amplification circuit 122A is reduced to ¼. More specifically, the period t1 to t3 and the period t5 to t7 are each several μ seconds, and therefore the drive frequencies of the amplification circuit 122A and the amplification circuit 122B become several ten to several hundred kHz or more. In this frequency band, the 1/f noise of a circuit takes a small value. Alternatively, in this frequency band, the thermal noise becomes more dominant than the 1/f noise in a circuit. Consequently, it is possible to reduce the notable effect of 1/f noise on pixel signals at low frequencies.

According to the present embodiment as described hereinabove, during a CDS operation, it is possible to suppress noise with respect to the voltage V2 or the voltage V3 generated by the voltage supply circuit 104. Thus, horizontal noise can be suppressed.

Here, the sizes of the transistor M5 included in the amplification circuit 122A and the transistor M6 included in the amplification circuit 122B are equal, for example. Specifically, the gate length and the gate width of the transistor M5 are equal to the gate length and the gate width of the transistor M6. In this case, the current I2 and the current I3 are equal. It is thereby possible to equalize the values of the voltage V2 that is output when the amplification circuit 122A is used and the voltage V3 that is output when the amplification circuit 122B is used. It is thereby possible for the voltage value of the voltage supply wiring 107 to be made to be constant even when the circuit used is switched between the amplification circuit 122A and the amplification circuit 122B.

It should be noted that the current I2 and the current I3 can be equalized also by making the ratio W1/L1 of the channel width W1 with respect to the channel length L1 of the transistor M5 to be equal to the ratio W2/L2 of the channel width W2 with respect to the channel length L2 of the transistor M6. It is thereby possible to equalize the values of the voltage V2 that is output when the amplification circuit 122A is used and the voltage V3 that is output when the amplification circuit 122B is used.

Furthermore, in the example depicted in FIG. 3, in a period in which the sample-and-hold circuits 109 read out pixel signals and reference signals, switching is performed in such a way that only one amplification circuit is used constantly. In such a case, there may be a difference between the value of the voltage V2 that is output when the amplification circuit 122A is used and the value of the voltage V3 that is output when the amplification circuit 122b is used. Even in a case where there is a difference between the voltage V2 and the voltage V3, a constant voltage is used constantly during a sampling and holding period, and therefore fluctuations in signal values caused by carrying out switching can be suppressed.

Furthermore, even in a case where an attempt has been made to set the sizes of the transistor M5 and the transistor M6 to be equal, there are cases where a difference occurs between the value of the voltage V2 and the value of the voltage V3 due to variations in the sizes of the transistors M5 and M6 that occur during manufacturing. Even in such a case, during a sampling and holding period in which the control signal CTS or the control signal CTN is high, voltage switching is not carried out and a constant voltage is applied to the load circuit, and therefore fluctuations in signal values caused by carrying out switching can be suppressed.

Furthermore, the drive frequencies of the amplification circuit 122A and the amplification circuit 122B become higher as the incidence of switching therebetween is increased. By setting the drive frequencies of the circuits to be several ten to several hundred kHz or more as mentioned above, the 1/f noise can be set to a small value. Thus, it is desirable for switching between the amplification circuit 122A and the amplification circuit 122B to be carried out at least once within one horizontal period, for example.

Figure 4:
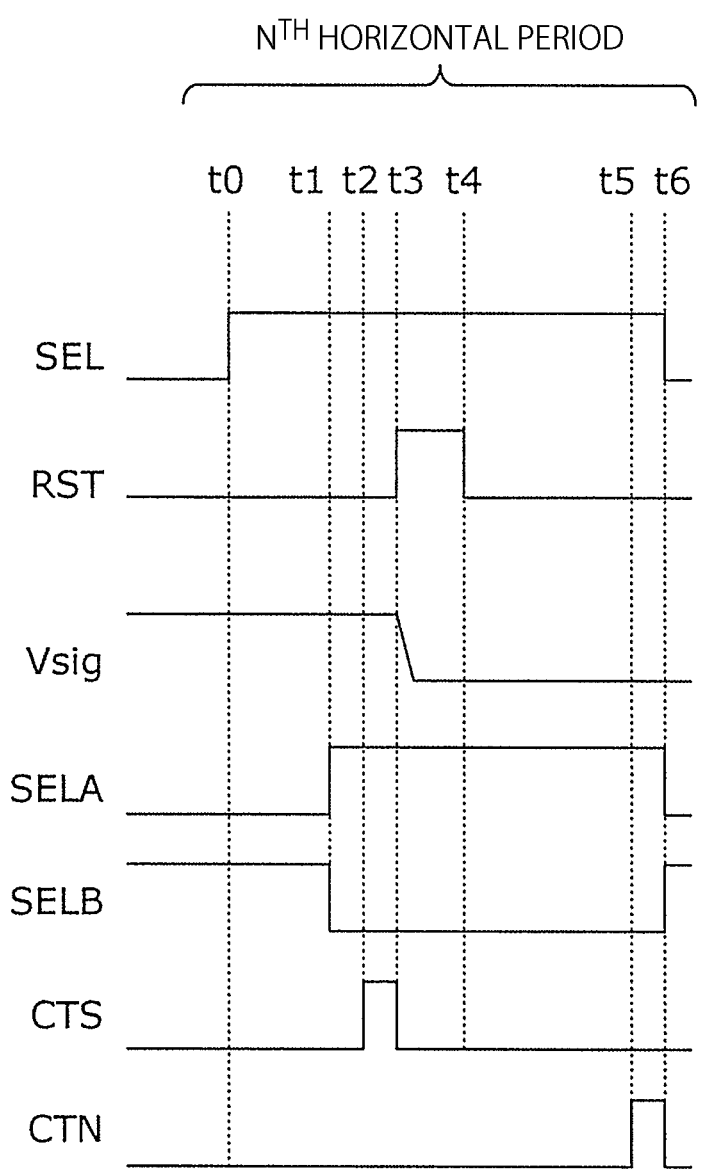
FIG. 4 is a timing chart depicting a modified example of the operation of the imaging device according to the first embodiment.

In FIG. 3, switching between the amplification circuit 122A and the amplification circuit 122B is carried out twice within one horizontal period; however, it should be noted that switching may be carried out once within one horizontal period, as depicted in FIG. 4. In the example depicted in FIG. 4, the amplification circuit 122A is used in the consecutive periods t1 to t5, which include a pixel signal read-out period t2 to t3 and a reference signal read-out period t5 to t6, and the amplification circuit 122B is used in the other period of t0 to t1. In this case also, one amplification circuit can be used constantly in a period in which the sample-and-hold circuits 109 read out pixel signals and reference signals.

Here, in a case where the incidence of switching between the amplification circuit 122A and the amplification circuit 122B has been increased and the drive frequencies of each of the circuits have been increased, although the 1/f noise in the circuits decreases, the voltage of the voltage supply wiring 107 may be likely to fluctuate. This is because there are cases where it is difficult to sufficiently stabilize fluctuations in the voltage of the voltage supply wiring 107 that occur during switching, due to the switching incidence being increased. Thus, this kind of fluctuation in the voltage of the voltage supply wiring 107 can be suppressed by using the control depicted in FIG. 4.

Second Embodiment

In the present embodiment, the voltage supply circuit 104 is different from that in the first embodiment. Hereinafter, a modified example of the voltage supply circuit 104 will be described. It should be noted that configurations that are the same as in the first embodiment are denoted by the same reference numbers and redundant descriptions are omitted.

Figure 5:
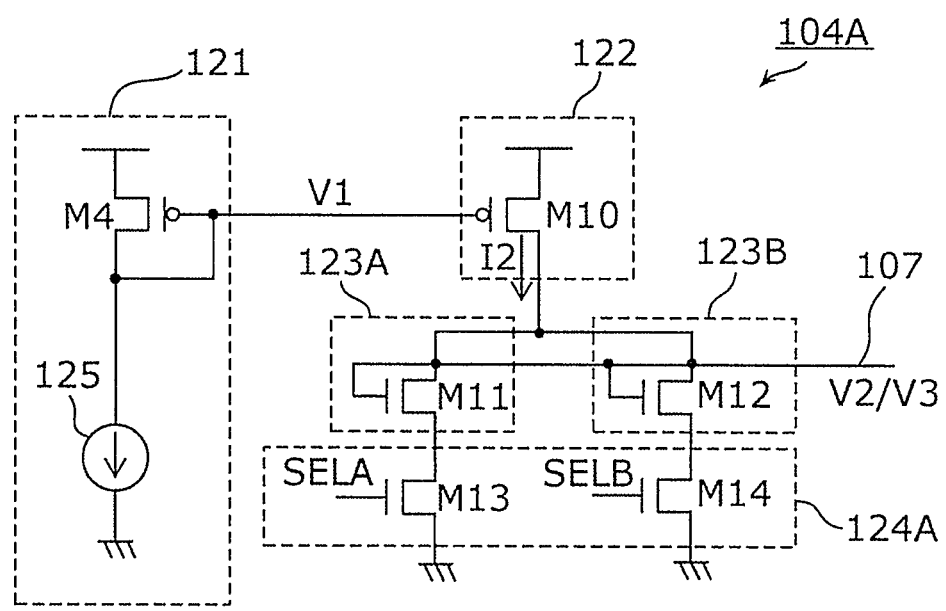
FIG. 5 is a drawing depicting a voltage supply circuit according to a second embodiment.

FIG. 5 is a drawing depicting the configuration of a voltage supply circuit 104A according to the present embodiment. The voltage supply circuit 104A includes the voltage generation unit 121, an amplification circuit 122, resistance circuits 123A and 123B, and a switching circuit 124A.

The amplification circuit 122 is electrically coupled to the voltage generation unit 121. The amplification circuit 122 is provided with a transistor M10 the gate of which is electrically coupled to the voltage generation unit 121. The voltage V1 is input from the voltage generation unit 121 to the gate of the transistor M10. The amplification circuit 122 amplifies and converts the voltage V1 into the current I2.

The resistance circuit 123A is electrically coupled to the voltage supply wiring 107. The resistance circuit 123A is provided with a transistor M11. The gate and drain of the transistor M11 and the drain of the transistor M10 are coupled to each other. The current I2 is input to the drain of the transistor M11. The transistor M11 converts the current I2 that flows between the source and drain into the voltage V2. The voltage V2 obtained by the conversion by the transistor M11 is applied to the gate of the load transistor ML via the voltage supply wiring 107.

The resistance circuit 123B is electrically coupled to the voltage supply wiring 107. The resistance circuit 123B is provided with a transistor M12. The gate and the drain of the transistor M12 and the drain of the transistor M10 are coupled to each other. The current I2 is input to the drain of the transistor M12. The transistor M12 converts the current I2 that flows between the source and drain into the voltage V3, and outputs the voltage V3 to the voltage supply wiring 107.

The switching circuit 124A is provided with a transistor M13 and a transistor M14. The transistor M13 is coupled in series to the transistor M11. Specifically, the drain of the transistor M13 and the source of the transistor M11 are coupled to each other. The transistor M14 is coupled in series to the transistor M12. Specifically, the drain of the transistor M14 and the source of the transistor M12 are coupled to each other. The switching circuit 124A switches which of the resistance circuit 123A and the resistance circuit 123B is coupled to the amplification circuit 122.

The transistor M4 and the transistor M10 form a current mirror circuit due to the source voltages and the gate voltages thereof being made common.

The signal SELA is supplied from the control circuit 108 to the gate of the transistor M13. The signal SELB is supplied from the control circuit 108 to the gate of the transistor M14. In a case where the signal SELA is high, the resistance circuit 123A is selected. In other words, the resistance circuit 123A is coupled to the amplification circuit 122. In a case where the signal SELB is high, the resistance circuit 123B is selected. In other words, the resistance circuit 123B is coupled to the amplification circuit 122.

Furthermore, the size of the transistor M11 and the size of the transistor M12 are equal, for example. Specifically, the gate length and the gate width of the transistor M11 are equal to the gate length and the gate width of the transistor M12. It is thereby possible to equalize the values of the voltage V2 that is output when the resistance circuit 123A is used and the voltage V3 that is output when the resistance circuit 123B is used. It is thereby possible for the voltage of the voltage supply wiring 107 to be made to be constant even when the circuit used is switched between the resistance circuit 123A and the resistance circuit 123B.

It should be noted that the values of the voltage V2 that is output when the resistance circuit 123A is used and the voltage V3 that is output when the resistance circuit 123B is used can be equalized also by making the ratio W3/L3 of the channel width W3 with respect to the channel length L3 of the transistor M11 to be equal to the ratio W4/L4 of the channel width W4 with respect to the channel length L4 of the transistor M12.

It should be noted that a timing chart for switching control in which the signal SELA and the signal SELB are used is similar to that in the first embodiment, for example. In other words, control that is similar to that depicted in FIG. 3 or FIG. 4 is carried out also in the second embodiment.

According to the above configuration, the effect of 1/f noise on pixel signals can be reduced in a manner similar to the first embodiment.

Third Embodiment

Figure 6:
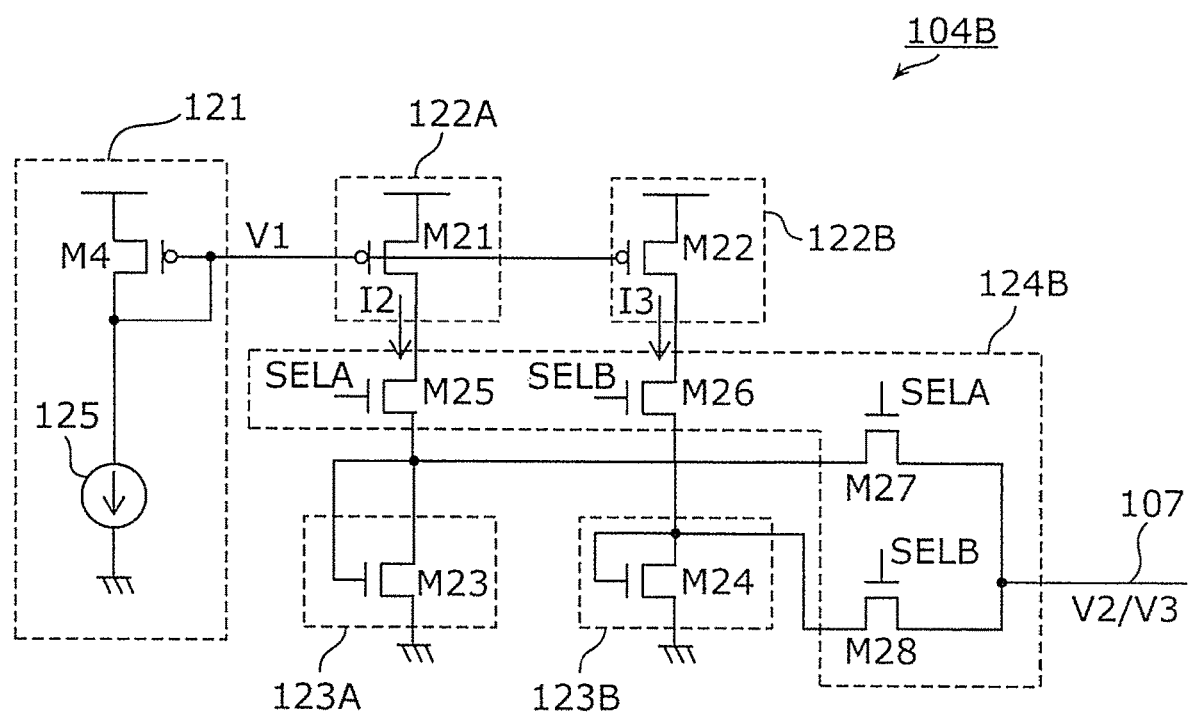
FIG. 6 is a drawing depicting a voltage supply circuit according to a third embodiment.

In the present embodiment, the voltage supply circuit 104 is different from those in the first embodiment and the second embodiment. Hereinafter, a modified example of the voltage supply circuit 104 will be described. It should be noted that configurations that are the same as in the first embodiment or the second embodiment are denoted by the same reference numbers and redundant descriptions are omitted. FIG. 6 is a drawing depicting the configuration of a voltage supply circuit 104B according to the present embodiment. The voltage supply circuit 104B includes the voltage generation unit 121, the amplification circuits 122A and 122B, the resistance circuits 123A and 123B, and a switching circuit 124B.

The amplification circuit 122A is electrically coupled to the voltage generation unit 121. The amplification circuit 122A is provided with a transistor M21 the gate of which is electrically coupled to the voltage generation unit 121. The voltage V1 is input from the voltage generation unit 121 to the gate of the transistor M21. The transistor M21 amplifies and converts the voltage V1 into the current I2.

The amplification circuit 122B is electrically coupled to the voltage generation unit 121. The amplification circuit 122B is provided with a transistor M22 the gate of which is electrically coupled to the voltage generation unit 121. The voltage V1 is input from the voltage generation unit 121 to the gate of the transistor M22. The transistor M21 amplifies and converts the voltage V1 into the current I3.

The resistance circuit 123A is electrically coupled to the amplification circuit 122A and the voltage supply wiring 107. The resistance circuit 123A is provided with a transistor M23. The gate and the drain of the transistor M23 are coupled to each other. The current I2 is input to the drain of the transistor M23. The transistor M23 converts the current I2 that flows between the source and the drain into the voltage V2. The voltage V2 obtained by the conversion by the transistor M23 is applied to the gate of the load transistor ML via the voltage supply wiring 107.

The resistance circuit 123B is electrically coupled to the amplification circuit 122B and the voltage supply wiring 107. The resistance circuit 123B is provided with a transistor M24. The gate and the drain of the transistor M24 are coupled to each other. The current I3 is input to the drain of the transistor M24. The transistor M24 converts the current I3 that flows between the source and the drain into the voltage V3. The voltage V3 obtained by the conversion by the transistor M24 is applied to the gate of the load transistor ML via the voltage supply wiring 107.

The switching circuit 124B is provided with transistors M25 to M28. The transistor M25 is coupled in series to the transistor M21. Specifically, the drain of the transistor M21 and the drain of the transistor M25 are coupled to each other. The transistor M26 is coupled in series to the transistor M22. Specifically, the drain of the transistor M22 and the drain of the transistor M26 are coupled to each other.

The source of the transistor M25 is coupled to the drain and the gate of the transistor M23. The source of the transistor M26 is coupled to the drain and the gate of the transistor M24. The transistor M27 is coupled between the drain and the gate of the transistor M23 and the voltage supply wiring 107. The transistor M28 is coupled between the drain and the gate of the transistor M24 and the voltage supply wiring 107.

The switching circuit 124B switches whether the current I2 is converted into the voltage V2 using a first circuit that includes the amplification circuit 122A and the resistance circuit 123A, or whether the current I3 is converted into the voltage V3 using a second circuit that includes the amplification circuit 122B and the resistance circuit 123B.

The transistor M4 and the transistor M21 form a current mirror circuit due to the source voltages and the gate voltages thereof being made common. The transistor M4 and the transistor M22 form a current mirror circuit due to the source voltages and the gate voltages being made common.

The signal SELA is supplied from the control circuit 108 to the gates of the transistor M25 and the transistor M27. The signal SELB is supplied from the control circuit 108 to the gates of the transistor M26 and the transistor M28. In a case where the signal SELA is high, the amplification circuit 122A and the resistance circuit 123A are selected. In other words, the voltage V1 is input to the amplification circuit 122A from the voltage generation unit 121, and the voltage V1 is converted into the current I2 and input to the resistance circuit 123A. The current I2 is converted into the voltage V2 by the resistance circuit 123A. Hereinafter, the amplification circuit 122A and the resistance circuit 123A that are selected at such time will be collectively referred to as circuit group 1. In a case where the signal SELB is high, the amplification circuit 122B and the resistance circuit 123B are selected. In other words, the voltage V1 is input to the amplification circuit 122B from the voltage generation unit 121, and the voltage V1 is converted into the current I3 and input to the resistance circuit 123B. The current I3 is converted into the voltage V3 by the resistance circuit 123B. Hereinafter, the amplification circuit 122B and the resistance circuit 123B that are selected at such time will be collectively referred to as circuit group 2.

The size of the transistor M21 and the size of the transistor M22 are equal, for example. Specifically, the gate length and the gate width of the transistor M21 are equal to the gate length and gate width of the transistor M22. Furthermore, the size of the transistor M23 and the size of the transistor M24 are equal, for example. Specifically, the gate length and the gate width of the transistor M23 are equal to the gate length and the gate width of the transistor M24. By setting the sizes of the transistors in this manner, it is possible to equalize the values of the voltages that are applied to the gate of the load transistor ML in the case where circuit group 1 is used and in the case where circuit group 2 is used. Thus, even when the set of circuits used is switched, the voltage that is applied to the load transistor ML can be made to be constant, and the operation of the load transistor ML can be made constant.

It should be noted that the ratio W5/L5 of the channel width W5 with respect to the channel length L5 of the transistor M21 may be set to be equal to the ratio W6/L6 of the channel width W6 with respect to the channel length L6 of the transistor M22. Furthermore, the ratio W7/L7 of the channel width W7 with respect to the channel length L7 of the transistor M23 may be set to be equal to the ratio W8/L8 of the channel width W8 with respect to the channel length L8 of the transistor M24. By setting these ratios in this manner, it is possible to equalize the values of the voltages that are applied to the load transistor ML in the case where circuit group 1 is used and in the case where circuit group 2 is used.

Furthermore, a case is also feasible where the channel width/channel length ratio W5/L5 of the transistor M21 and the channel width/channel length ratio W6/L6 of the transistor M22 are different. Even in such a case, the W/L ratios of the transistor M23 and the transistor M24 are desirably set in accordance with the aforementioned W/L ratios. It is thereby possible to equalize the values of the voltages that are applied to the load transistor ML in the case where the set of the amplification circuit 122A and the resistance circuit 123A is used and in the case where the set of the amplification circuit 122B and the resistance circuit 123B is used. For example, assuming that W5/L5 is 1 in the transistor M21 and W6/L6 is 2 in the transistor M22, in this case, the W/L of the transistor M23 can be set to 2 and the W/L of the transistor M24 can be set to 4.

Furthermore, as mentioned above, the values of the voltage V2 and the voltage V3 may be different. Thus, as mentioned above, the difference between the voltage V2 and the voltage V3 can be reduced by setting the magnitude relationship between the transistor M23 and the transistor M24 in accordance with the magnitude relationship between the W/L of the transistor M21 and the W/L of the transistor M22. That is, in a case where the W/L of the transistor M21 is greater than the W/L of the transistor M22, the W/L of the transistor M23 is set to be greater than the W/L of the transistor M24. Furthermore, in a case where the W/L of the transistor M21 is less than the W/L of the transistor M22, the W/L of the transistor M23 is set to be less than the W/L of the transistor M24. The difference between the voltage V2 and the voltage V3 can thereby be reduced.

Furthermore, as depicted in FIG. 3 or FIG. 4, a case is assumed where the circuit group 1 is used constantly in a period in which pixel signals and reference signals are read out. In this case, W6/L6 of the transistor M22 may be set to be less than W5/L5 of the transistor M21. Furthermore, W8/L8 of the transistor M24 may be set to be less than W7/L7 of the transistor M23. The area of the amplification circuit 122B or the resistance circuit 123B can thereby be reduced. Furthermore, thermal noise in a period in which pixel signals and reference signals are read out can thereby be suppressed. Furthermore, the current consumption in periods other than a period in which pixel signals and reference signals are read out can be reduced.

According to the above configuration, 1/f noise can be reduced. Furthermore, in the present embodiment, 1/f noise in both the amplification circuits and the resistance circuits can be reduced.

Fourth Embodiment

Figure 7:
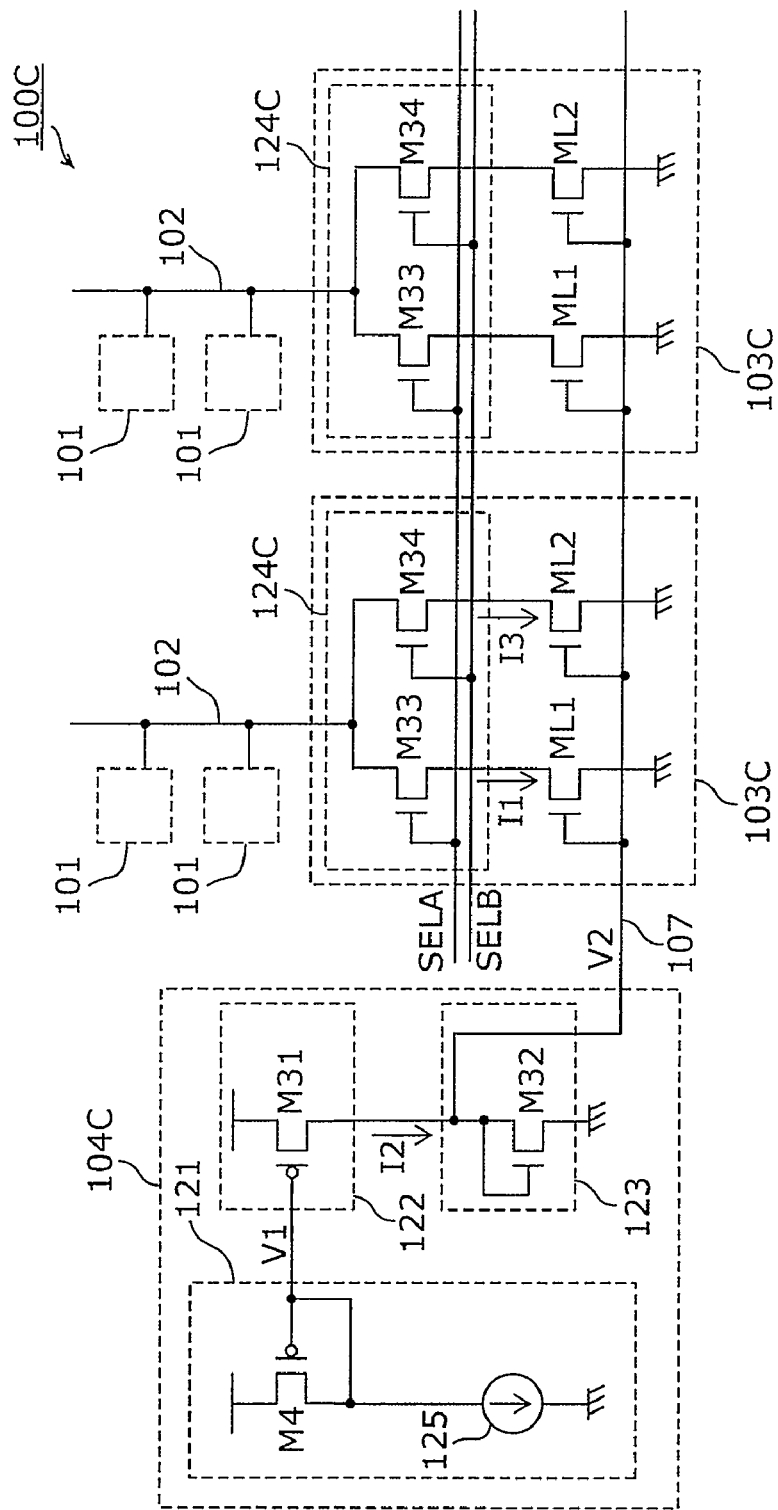
FIG. 7 is a drawing depicting the configuration of an imaging device according to a fourth embodiment.

FIG. 7 is a drawing depicting the configuration of an imaging device 100C according to the present embodiment. In the imaging device 100C depicted in FIG. 7, the configurations of a voltage supply circuit 104C and load circuits 103C are different from those in the first embodiment. It should be noted that the column signal processing circuits 106 and the control circuit 108 are not depicted in FIG. 7.

The voltage supply circuit 104C includes the voltage generation unit 121, the amplification circuit 122, and the resistance circuit 123. The voltage generation unit 121 generates a voltage V1 that is a constant voltage. The amplification circuit 122 is electrically coupled to the voltage generation unit 121. The amplification circuit 122 is provided with a transistor M31 the gate of which is electrically coupled to the voltage generation unit 121. The voltage V1 is input from the voltage generation unit 121 to the gate of the transistor M31. The transistor M31 amplifies and converts the input voltage V1 into the current I2.

The resistance circuit 123 is electrically coupled to the voltage supply wiring 107. The resistance circuit 123 is provided with a transistor M32. The current I2 is input to the drain of the transistor M32, the gate and the drain of the transistor M32 being coupled to each other. The transistor M32 converts the current I2 that flows between the source and the drain into the voltage V2. The voltage V2 obtained by the conversion by the transistor M32 is input to the load circuits 103C via the voltage supply wiring 107.

The load circuit 103C is provided with a load transistor ML1, a load transistor ML2, and a switching circuit 124C.

The load transistor ML1 and the load transistor ML2 form a source follower circuit with the amplification transistor M2. The voltage V2 is supplied via the voltage supply wiring 107 to the gates of the load transistor ML1 and the load transistor ML2. The load transistor ML1 converts the voltage V2 that has been input to the gate thereof into the current I1 which is then output. The load transistor ML2 converts the voltage V2 that has been input to the gate thereof into the current I3 which is then output.

One of the source and the drain of the load transistor ML1 is coupled to the vertical signal line 102 arranged in the corresponding column, via the switching circuit 124C. The load transistor ML1 supplies the constant current I1 to the vertical signal line 102 arranged in the corresponding column.

One of the source and the drain of the load transistor ML2 is coupled to the vertical signal line 102 arranged in the corresponding column, via the switching circuit 124C. The load transistor ML2 supplies the constant current I3 to the vertical signal line 102 arranged in the corresponding column.

The switching circuit 124C selectively electrically couples either of the load transistor ML1 and the load transistor ML2 to the vertical signal lines 102. The switching circuit 124C includes a transistor M33 and a transistor M34. The transistor M33 is coupled in series to the load transistor ML1. Specifically, the transistor M33 is coupled between the transistor ML1 and a vertical signal line 102. The transistor M34 is coupled in series to the load transistor ML2. Specifically, the transistor M34 is coupled between the transistor ML2 and the vertical signal line 102.

The signal SELA is supplied to the gate of the transistor M33, and the signal SELB is supplied to the gate of the transistor M34. In a case where the signal SELA is high, the load transistor ML1 is coupled to the vertical signal line 102, and the current I1 is supplied to the vertical signal line 102. In a case where the signal SELB is high, the load transistor ML2 is coupled to the vertical signal line 102, and the current I3 is supplied to the vertical signal line 102.

Furthermore, the size of the load transistor ML1 and the size of the load transistor ML2 are equal, for example. Specifically, the gate length and the gate width of the load transistor ML1 are equal to the gate length and the gate width of the load transistor ML2. The current I1 and the current I3 can thereby be equalized.

It should be noted that the current I1 and the current I3 can be equalized by making the ratio W9/L9 of the channel width W9 with respect to the channel length L9 of the load transistor ML1 to be equal to the ratio W10/L10 of the channel width W10 with respect to the channel length L10 of the load transistor ML2.

The switching control in which the signal SELA and the signal SELB are used in the present embodiment is similar to that in the first embodiment, for example. In other words, the control depicted in FIG. 3 or FIG. 4 is carried out, for example.

According to the above configuration, 1/f noise in a load transistor can be reduced. Thus, horizontal noise can be suppressed.

Fifth Embodiment

In the present embodiment, a camera system provided with the aforementioned imaging device 100 will be described.

Figure 8:
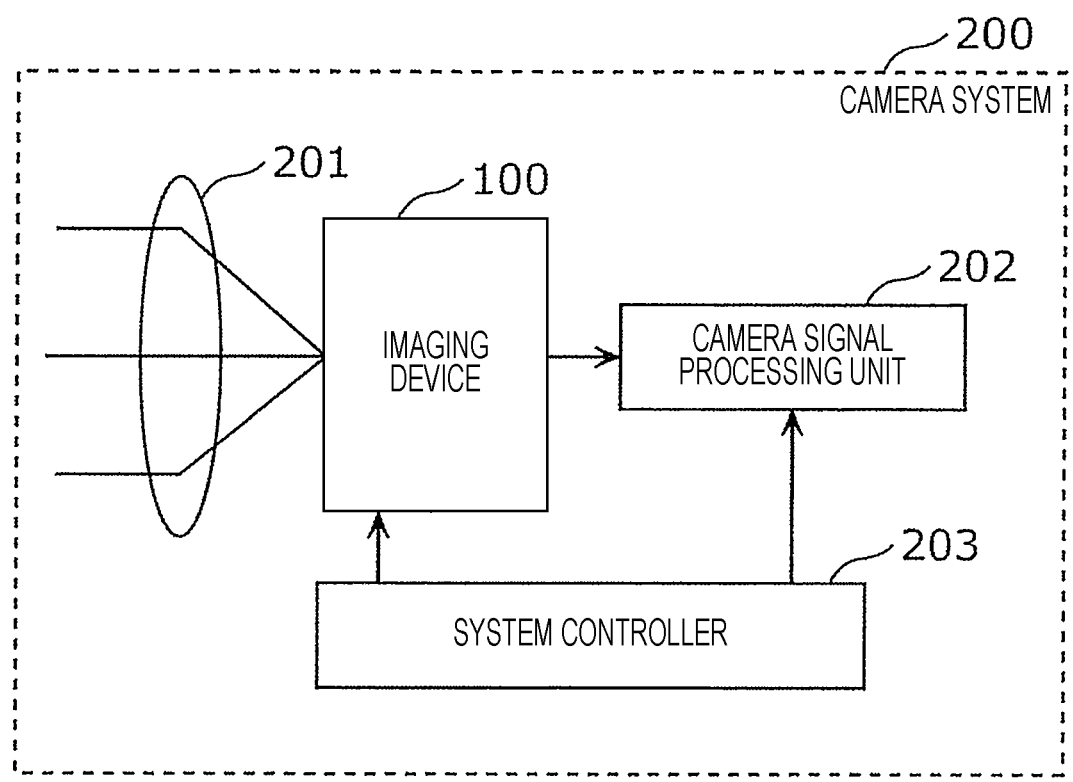
FIG. 8 is a block diagram depicting an exemplary configuration of a camera system according to a fifth embodiment.

FIG. 8 is a block diagram depicting an example of the configuration of a camera system 200 according to the present embodiment. This camera system 200 is used in, for example, a smartphone, a video camera, a digital still camera, a surveillance camera, a vehicle-mounted camera, or the like.

This camera system 200 is provided with the imaging device 100, a lens 201, a camera signal processing unit 202, and a system controller 203.

The lens 201 is an optical element for guiding incident light onto the pixel array provided in the imaging device 100.

The imaging device 100 is the imaging device 100 or 100C according to the aforementioned embodiments, for example. The imaging device 100 converts image light formed on an imaging surface by the lens 201 into electrical signals in pixel units, and outputs obtained image signals.

The camera signal processing unit 202 is a circuit that performs various types of processing on the image signals generated by the imaging device 100.

The system controller 203 is a control unit that drives the imaging device 100 and the camera signal processing unit 202.

The image signals processed by the camera signal processing unit 202 are recorded as still images or video in a recording medium such as a memory, for example. Alternatively, the image signals are shown as video on a monitor configured from a liquid crystal display or the like.

The camera system 200 according to the present embodiment can reduce 1/f noise by using the aforementioned imaging device 100.

Hereinabove, imaging devices according to embodiments of the present disclosure have been described; however, the present disclosure is not restricted to these embodiments.

For example, the divisions of the functional blocks in the block diagrams are examples, and a plurality of functional blocks may be realized as one functional block and one functional block may be divided into a plurality in such a way that some functions are moved to other functional blocks.

Furthermore, each processing unit included in each device according to the aforementioned embodiments is typically realized as an LSI, which is an integrated circuit. These may be implemented separately as single chips, or may be implemented as a single chip in such a way as to include some or all of the functions.

Furthermore, the circuit integration is not restricted to an LSI, and the functions may be realized using a dedicated circuit or a general-purpose processor. After an LSI has been manufactured, an FPGA (field-programmable gate array) that can be programmed, or a reconfigurable processor with which the connections and settings of circuit cells within the LSI can be reconfigured, may be used.

Furthermore, in the aforementioned embodiments, some of the constituent elements may be realized by using dedicated hardware, or may be realized by executing a software program suitable for the constituent elements. The constituent elements may be realized by a program execution unit such as a CPU or a processor reading out and executing a software program recorded in a recording medium such as a hard disk or a semiconductor memory.

The imaging device according to the present disclosure can be used in various camera systems and sensor systems, such as digital still cameras, broadcasting cameras, medical cameras, surveillance cameras, vehicle-mounted cameras, digital single-lens reflex cameras, and digital mirrorless single-lens cameras.

What is claimed is:

1. An imaging device comprising:
   a pixel including a photoelectric converter that converts light into charges, the pixel outputting a first signal corresponding to an amount of the charges;
   an output signal line coupled to the pixel, the first signal output from the pixel being transmitted through the output signal line;
   a load transistor having a source, a drain, and a gate, one of the source and the drain being coupled to the pixel via the output signal line; and
   a voltage supply circuit coupled to the gate of the load transistor, the voltage supply circuit selectively supplying either a first voltage or a second voltage to the gate,
   wherein the voltage supply circuit includes:
      a voltage generator that generates a third voltage;
      a first amplification circuit coupled to the voltage generator, the first amplification circuit amplifying the third voltage to generate a first current;
      a second amplification circuit coupled to the voltage generator, the second amplification circuit amplifying the third voltage to generate a second current; and
      a resistance circuit coupled to the gate, the resistance circuit generating the first voltage from the first current, the resistance circuit generating the second voltage from the second current.

2. The imaging device according to claim 1, further comprising
   a control circuit that causes the voltage supply circuit to selectively supply either the first voltage or the second voltage to the gate.

3. The imaging device according to claim 1, wherein the voltage supply circuit includes a switching circuit that switches between generating the first voltage and generating the second voltage.

4. The imaging device according to claim 1, wherein
   the first amplification circuit includes a first transistor having a gate coupled to the voltage generator,
   the second amplification circuit includes a second transistor having a gate coupled to the voltage generator, and
   a ratio of a channel width of the first transistor with respect to a channel length of the first transistor is equal to a ratio of a channel width of the second transistor with respect to a channel length of the second transistor.

5. The imaging device according to claim 1, wherein the voltage supply circuit includes:
   a third transistor coupled in series to the first amplification circuit; and a fourth transistor coupled in series to the second amplification circuit, and either the third transistor or the fourth transistor is selectively caused to be on.

6. The imaging device according to claim 1, An imaging device comprising:

a pixel including a photoelectric converter that converts light into charges, the pixel outputting a first signal corresponding to an amount of the charges;

an output signal line coupled to the pixel, the first signal output from the pixel being transmitted through the output signal line;

a load transistor having a source, a drain, and a gate, one of the source and the drain being coupled to the pixel via the output signal line; and a voltage supply circuit coupled to the gate of the load transistor, the voltage supply circuit selectively supplying either a first voltage or a second voltage to the gate, wherein the voltage supply circuit includes:

a voltage generator that generates a third voltage;

an amplification circuit coupled to the voltage generator, the amplification circuit amplifying the third voltage to generate a first current;

a first resistance circuit that generates the first voltage from the first current; and a second resistance circuit that generates the second voltage from the first current.

7. The imaging device according to claim 6, wherein the first resistance circuit includes a first transistor one of a source and a drain of which is coupled to the gate of the load transistor, the second resistance circuit includes a second transistor one of a source and a drain of which is coupled to the gate of the load transistor, and a ratio of a channel width of the first transistor with respect to a channel length of the first transistor is equal to a ratio of a channel width of the second transistor with respect to a channel length of the second transistor.

8. The imaging device according to claim 6, wherein the voltage supply circuit includes:

a third transistor coupled in series to the first resistance circuit; and a fourth transistor coupled in series to the second resistance circuit, and either the third transistor or the fourth transistor is selectively caused to be on.

9. An imaging device comprising:

a pixel including a photoelectric converter that converts light into charges, the pixel outputting a first signal corresponding to an amount of the charges;

an output signal line coupled to the pixel, the first signal output from the pixel being transmitted through the output signal line;

a load transistor having a source, a drain, and a gate, one of the source and the drain being coupled to the pixel via the output signal line; and a voltage supply circuit coupled to the gate of the load transistor, the voltage supply circuit selectively supplying either a first voltage or a second voltage to the gate, wherein the voltage supply circuit includes:

a voltage generator that generates a third voltage;

a first amplification circuit coupled to the voltage generator, the first amplification circuit amplifying the third voltage to generate a first current;

a first resistance circuit that generates the first voltage from the first current;

a second amplification circuit coupled to the voltage generator, the second amplification circuit amplifying the third voltage to generate a second current; and a second resistance circuit that generates the second voltage from the second current.

10. The imaging device according to claim 9, wherein the first amplification circuit includes a first transistor having a gate coupled to the voltage generator, the first resistance circuit includes a second transistor one of a source and a drain of which is coupled to the gate of the load transistor, the second amplification circuit includes a third transistor having a gate coupled to the voltage generator, and the second resistance circuit includes a fourth transistor one of a source and a drain of which is coupled to the gate of the load transistor.

11. The imaging device according to claim 10, wherein a ratio of a channel width of the first transistor with respect to a channel length of the first transistor is greater than a ratio of a channel width of the third transistor with respect to a channel length of the third transistor, and a ratio of a channel width of the second transistor with respect to a channel length of the second transistor is greater than a ratio of a channel width of the fourth transistor with respect to a channel length of the fourth transistor.

12. The imaging device according to claim 10, wherein a ratio of a channel width of the first transistor with respect to a channel length of the first transistor is less than a ratio of a channel width of the third transistor with respect to a channel length of the third transistor, and a ratio of a channel width of the second transistor with respect to a channel length of the second transistor is less than a ratio of a channel width of the fourth transistor with respect to a channel length of the fourth transistor.

13. The imaging device according to claim 1, wherein the voltage supply circuit switches between the first voltage and the second voltage one or more times in one horizontal period.

14. The imaging device according to claim 13, further comprising a sample-and-hold circuit coupled to the output signal line, the sample-and-hold circuit reading out and retaining the first signal, wherein the pixel outputs a second signal to the output signal line in a state where the charges have been reset, and the voltage supply circuit supplies the first voltage in a first period including a period when the sample-and-hold circuit reads out the first signal, supplies the first voltage in a second period including a period when the sample-and-hold circuit reads out the second signal, and supplies the second voltage in a third period different from either of the first period and the second period.

15. The imaging device according to claim 14, wherein, in the one horizontal period, the third period is located between the first period and the second period.

16. The imaging device according to claim 14, wherein, in the one horizontal period, the first period and the second period are consecutive.

17. A camera system comprising the imaging device according to claim 1.

18. The imaging device according to claim 6, further comprising a control circuit that causes the voltage supply circuit to selectively supply either the first voltage or the second voltage to the gate.

19. The imaging device according to claim 9, further comprising a control circuit that causes the voltage supply circuit to selectively supply either the first voltage or the second voltage to the gate.

* * * * *